(12) United States Patent
Wakabayashi et al.

(10) Patent No.: US 6,469,421 B1
(45) Date of Patent: Oct. 22, 2002

(54) PIEZOELECTRIC DEVICE AND PRODUCTION METHOD THEREOF

(75) Inventors: Mari Wakabayashi, Chiba (JP); Masataka Shinogi, Chiba (JP); Toshihiko Sakuhara, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/426,659

(22) Filed: Oct. 25, 1999

(30) Foreign Application Priority Data

Oct. 26, 1998 (JP) .......................................... 10-304417
Aug. 24, 1999 (JP) .......................................... 11-237349

(51) Int. Cl.$^7$ ............................................... H01L 41/08
(52) U.S. Cl. ..................................................... 310/328
(58) Field of Search ........................... 310/328, 323.11; 427/100

(56) References Cited

U.S. PATENT DOCUMENTS 5,681,410 A * 2/1993 Takeuchi ..................... 427/100
6,103,072 A * 8/2000 Nishiwaki ..................... 310/358
6,284,434 B1 * 9/2001 Kamei et al. .................. 430/311
6,332,254 B1 * 12/2001 Usui et al. ..................... 216/27

* cited by examiner

*Primary Examiner*—Karl Tamai
*Assistant Examiner*—Karen Addison
(74) *Attorney, Agent, or Firm*—Adams & Wilks (57) ABSTRACT

A piezoelectric device having improved characteristics is accomplished by restricting degradation and variance of vibration characteristics resulting from an adhesive, and a production process is simplified. The piezoelectric device has a construction in which a ultra-fine particle layer made of substantially the same main component and having the same crystal structure as those of a piezoelectric layer is formed on a substrate, and the piezoelectric layer is formed on the ultra-fine particle layer.

32 Claims, 11 Drawing Sheets

PRIOR ART

PIEZOELECTRIC DEVICE AND PRODUCTION METHOD THEREOF

BACKGROUND OF THE INVENTION

This invention relates to a piezoelectric device for use in a ultrasonic motor, a piezoelectric actuator, a piezoelectric sensor, and so forth, and also to a method of producing the piezoelectric device.

Recently, a piezoelectric actuator has drawn increasing attention in the field of mobile information equipment and in chemical and medical fields as a novel motor that can accomplish further scale-down and lightening of a motor and that will replace conventional solenoid type motors. The piezoelectric actuator does not generate electromagnetic noise when it is driven, and is not affected by noise, either. To fabricate appliances having a size of a sub-millimeter class, a very small piezoelectric actuator has been required as the driving source of the appliances. A piezoelectric device has been employed in vibration portions of the ultrasonic motor, the piezoelectric actuator, and so forth. Initially, the construction of the piezoelectric device according to the prior art will be explained.

Figure 14:
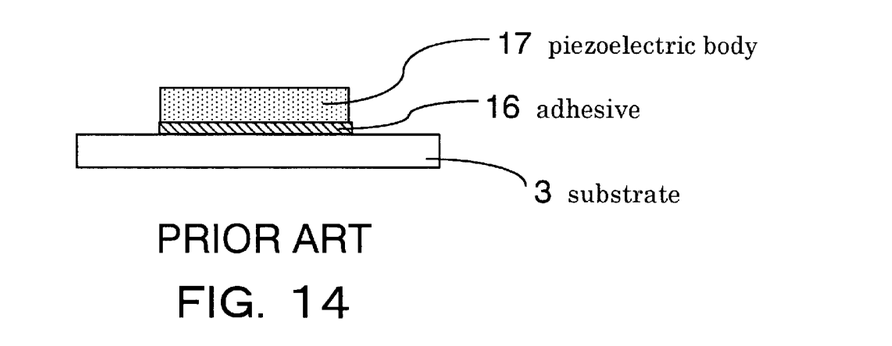
FIG. 14 is a schematic view showing a piezoelectric device produced by a conventional production method.
Figure 15:
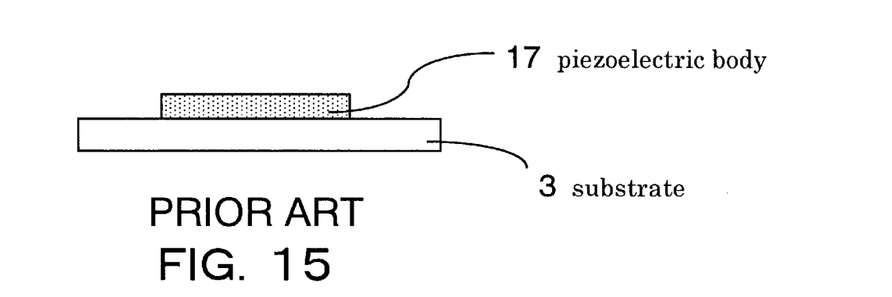
FIG. 15 is a schematic view showing the piezoelectric device produced by the conventional production method.

FIGS. 14 and 15 show the construction of the conventional piezoelectric device. Generally, a piezoelectric body 17 produced by processing a sinter of a bulk material is placed at a predetermined position on a substrate made of a metal or silicon. FIG. 14 shows a piezoelectric device fabricated by bonding a substrate 3 and a piezoelectric body 17 through an adhesive 16. The piezoelectric body is produced by polishing a sinter of a bulk material into a desired size and a desired thickness, or by rapping a green sheet and heat-treating it. Such a sinter of the bulk material and the mold from the green sheet are generally at least about 100 μm thick.

On the other hand, the piezoelectric body can be directly formed on the substrate by sputtering or printing in place of the bonding method using the adhesive. FIG. 15 shows the piezoelectric device fabricated by such a direct formation method. Generally, the piezoelectric body formed by sputtering or a sol-gel method has a thickness ranging from hundreds of angstroms to several microns, and the thickness ranges from 50 to hundreds of microns in the case of the printing method.

In either construction, electrodes are disposed on the piezoelectric body 17, and an AC voltage is applied through them.

Figure 16:
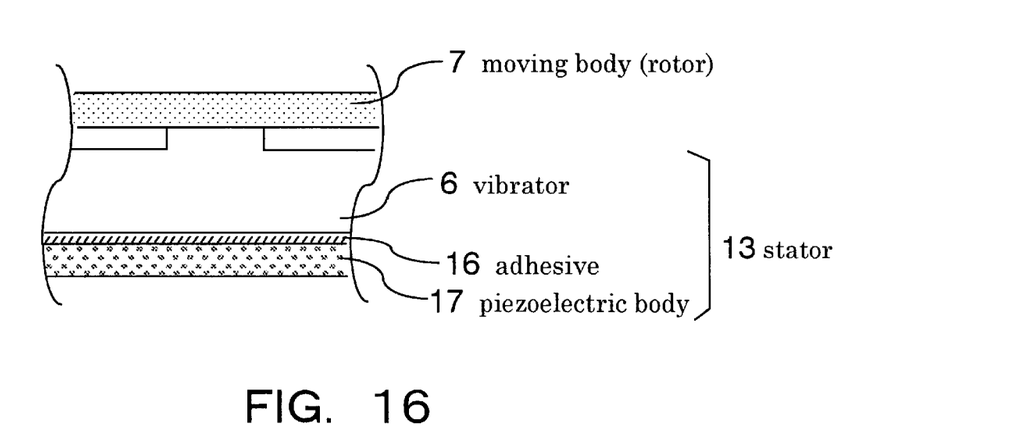
FIG. 16 is a schematic view showing a vibration portion of a ultrasonic motor using the conventional piezoelectric device.

FIG. 16 shows a schematic construction of an ultrasonic motor using such a piezoelectric device for its vibration portion. The ultrasonic motor comprises a stator 13 and a moving member 7 (rotor). The stator 13 generally includes a vibrator 6 made of a flexible material and a piezoelectric body 17 equipped with electrodes. The vibrator 6 and the piezoelectric body 17 are bonded by an adhesive 16. When an AC voltage is applied to the piezoelectric body 17 in the ultrasonic motor having such a construction, the force is generated by the piezoelectric effect, propagates through the vibrator 6, and drives the moving body 7 that is kept in pressure contact with the stator 13 (vibrator 6).

As typified by the explanation given above, the basic construction of the piezoelectric device is the bonding construction of the piezoelectric device and the substrate by the adhesive, or the construction in which the piezoelectric body is directly formed on the substrate.

However, these conventional constructions are not free from the following problems. When the adhesive is used, the force generated from the piezoelectric body is reflected irregularly or absorbed by the adhesive layer during its propagation, with the result being not only the drop of electrical and mechanical performance and reliability of the vibration portion but also peeling on the bonding interface with the piezoelectric body. This problem becomes particularly serious when the vibration portion of the piezoelectric device is used as a driving source of a miniature structure because its size is of a sub-millimeter class and the influences of the adhesive layer become relatively greater.

The essential cause of such a problem lies in that the adhesive layer and its boundary surface are dynamically unstable. To solve this problem, methods of directly forming the piezoelectric body on the vibrator have been examined vigorously in recent years.

Representative methods of producing directly the piezoelectric body include sputtering and CVD. Though they have the merit that devices having a very small size can be formed, they are not yet free from the problem that an extremely large number of fabrication steps are necessary. To create driving force of the actuator, the piezoelectric layer must be formed to a thickness of up to dozens of microns, but these methods cannot easily give such a thickness.

Another typical method is a screen printing method that has been used widely for a piezoelectric element of ink jet printer heads. This production method applies a piezoelectric paste to a substrate, followed by drying and firing. However, since firing is conducted at a temperature of 1,000° C. or above, there occur the problems that heat cracks develop due to the difference of the thermal stress between the substrate and the piezoelectric paste and that a heat-resistant substrate must therefore be used.

A hydrothermal method is known as still another method of forming directly the piezoelectric body. This method allows a strongly alkaline solution of a ferroelectric ceramic material consisting of lead zirco-titanate (hereinafter called "PZT") to react in an autoclave, and forms PZT on a titanium or titanium oxide substrate. According to this method, the substrate capable of forming PZT is limited to titanium or a titanium-containing material.

SUMMARY OF THE INVENTION

It is therefore an object of the present invention to provide a method of producing a stable piezoelectric device having improved properties, wherein the piezoelectric device, can solve the problems described above and can simplify the production process.

To accomplish the object described above, the present invention forms a ultra-fine particle layer between a substrate and piezoelectric layer in a construction of a piezoelectric device, wherein the ultra-fine particle layer consists of substantially the same main component as the main component of the piezoelectric layer.

In the present invention, the ultra-fine particle layer is formed between the substrate and piezoelectric layer, and this ultra-fine particle layer has substantially the same crystal structure as the crystal structure of the piezoelectric layer.

The ultra-fine particle layer and the piezoelectric layer contain titanium, zirconium and lead. Furthermore, the particle diameter of ultra-fine particles forming the ultra-fine particle layer is not greater than 1 μm.

To produce the piezoelectric device having the construction described above, a production method according to the present invention comprises the first step of forming an ultra-fine particle layer on a substrate and the second step of forming a piezoelectric layer on the ultra-fine particle layer.

The first step of forming the ultra-fine particle layer forms the ultra-fine particle layer by applying a paste-like solution containing the ultra-fine particles to the substrate.

The first step of forming the ultra-fine particle layer forms the ultra-fine particle layer by ejecting and depositing the ultra-fine particles onto the substrate.

Alternatively, a production method of the present invention comprises the first step of forming an ultra-fine particle layer on a substrate and the second step of bonding a piezoelectric body onto the ultra-fine particle layer.

In the second step of bonding the piezoelectric body onto the ultra-fine particle layer, the hydrogen bonds are used as means for bonding the ultra-fine particle layer and the piezoelectric layer.

DETAILED DESCRIPTION OF THE PREFERRED EMBODIMENTS

A piezoelectric device according to the present invention includes a ultra-fine particle layer between a substrate and a piezoelectric layer, and this ultra-fine particle layer consists of substantially the same main component as the main component of the piezoelectric layer. Since the ultra-fine particle layer and the piezoelectric layer consist of the same main component in this way, adhesion between the substrate and piezoelectric layer can be improved and moreover, the difference of thermal expansion between the piezoelectric layer and the bonding layer can be decreased during firing.

The ultra-fine particle layer is formed between the substrate and the piezoelectric layer, and this ultra-fine particle layer has substantially the same crystal structure as the crystal structure of the piezoelectric layer. According to this construction, the ultra-fine particle layer having the same crystal structure is disposed at the bond portion of the piezoelectric layer with the substrate, and adhesion between the substrate and the piezoelectric layer can be improved. AS the layers having the same crystal structure are brought into mutual contact on the boundary surface between the layers, the lattice gap of the crystals forming each layer is approximate to one another, and the strain between the lattices becomes small. In consequence, absorption and irregular reflection of the piezoelectric vibration that occur in the bonding layer become more difficult to occur.

The ultra-fine particle layer and the piezoelectric layer contain titanium, zirconium and lead. Since titanium, zirconium and lead, the components of PZT exhibiting particularly excellent piezoelectric characteristics among the piezoelectric substances, are used for both of the ultra-fine particle layer and the piezoelectric layer, variance of the vibration characteristics of the piezoelectric body due to bonding and characteristic defects can be decreased.

The particle size of the ultra-fine particles forming the ultra-fine particle layer is not greater than 1 $\mu$m. Because ultra-fine particles of not greater than 1 $\mu$m, that are smaller than the surface coarseness and swell of the piezoelectric body, are used for the bonding layer, the number of contact points between the substrate and the piezoelectric body can be increased and adhesion can be improved. Because the proportion of the surface area to the volume of the particles (specific surface area) can be increased by decreasing the particle size, surface energy of the bonding layer increases as serves and a driving source of heat energy at the time of firing. Therefore, firing can be conducted at a lower temperature than a firing temperature of ordinary PZT type piezoelectric bodies.

Alternatively, a production method of a piezoelectric device according to the present invention comprises the first step of forming an ultra-fine particle layer on a substrate and the second step of forming a piezoelectric layer on the ultra-fine particle layer.

The first step of forming the ultrasonic layer forms the ultra-fine particle layer by applying a paste-like solution containing the ultra-fine particles to the substrate. In other words, a paste of the ultra-fine particles containing a formation adjuvant such as polyvinyl alcohol or glycerin is used for the bonding layer. The formation adjuvant plays the role of bonding and fixing the ultra-fine particles with one another, improves adhesion with the piezoelectric layer after firing and moreover, provides sufficient strength. When the piezoelectric layer is formed from a green sheet, the green sheet of the piezoelectric layer can be pressed in close adhesion with the paste of the ultra-fine particles, and the paste and the piezoelectric layer can be fired simultaneously.

The first step of forming the ultra-fine particle layer forms the ultra-fine particles on the substrate by ejection and deposition. Because the ultra-fine particles having a high speed and extremely great kinetic energy are caused to directly impinge against the substrate, adhesion with the substrate can be improved, and the ultra-fine particle layer having a sufficient strength can be formed.

Deterioration of the oscillation characteristics of the piezoelectric body can be prevented by using the ultra-fine particles having the same crystal structure and the same component as those of the piezoelectric layer.

When the ultra-fine particles having a particle size of about 0.1 μm are used, these particles can be easily carried by the flow of the gas molecules and can be converted easily to the aerosol state. In other words, the ultra-fine particles having a high speed and large kinetic energy can be ejected and deposited.

Alternatively, the production method of the piezoelectric device according to the present invention comprises the first step of forming an ultra-fine particle layer on a substrate and the second step of bonding a piezoelectric body onto the ultra-fine particle layer. Because the ultra-fine particles having the same component as that of the piezoelectric body are formed directly on the substrate, adhesion with the substrate can be improved much more than when the piezoelectric body is bonded through an adhesive. Moreover, because the ultra-fine particles having the same crystal structure as that of the piezoelectric layer are used and because the surfaces having mutually the same lattice gaps are bonded on the bonding surface, bonding can be made in the atomic level, and adhesion with the piezoelectric layer can be improved.

The second step of bonding the piezoelectric body onto the ultra-fine particle layer uses the hydrogen bonds as means for bonding the ultra-fine particle layer and the piezoelectric body. This step allows the hydroxyl groups to be adsorbed to the bonding surface between the ultra-fine particle layer and the piezoelectric layer having the same crystal structure, and utilizes the hydrogen bonds between the hydroxyl groups for bonding. Unlike metallic bonds and covalent bonds, this step has the advantages that it does not require a high temperature heat-treatment for creating the bonds, and that it has relatively greater flexibility in the bonding angles and the bonding distance. The interatomic distances of the oxygen and hydrogen atoms associated with bonding are only several angstroms. In consequence, the thickness of the bonding layer is by far smaller than the thickness of the conventional bonding layer using the adhesive, and the possibility is extremely low that the vibration of the piezoelectric body is absorbed or irregularly reflected by the bonding layer.

Hereinafter, some embodiments of the present invention will be explained with reference to the accompanying drawings.

Embodiment 1

Figure 1:
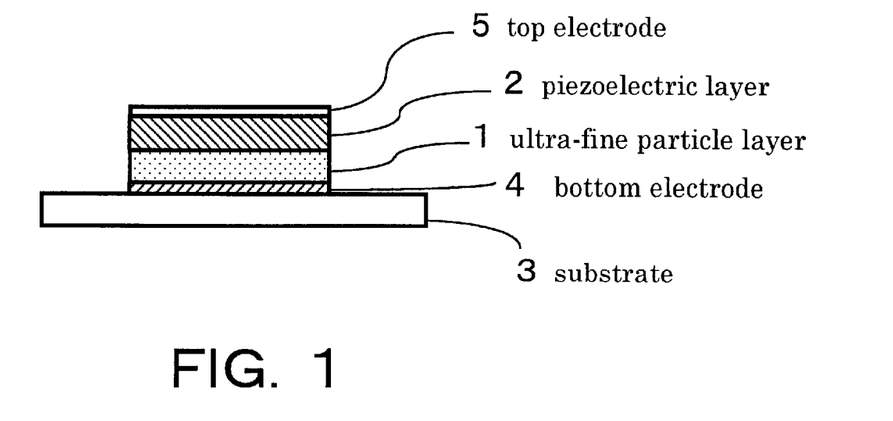
FIG. 1 is a schematic view showing a construction of a piezoelectric device according to the present invention.

FIG. 1 is a longitudinal sectional view showing a construction of a piezoelectric device according to Embodiment 1. A bottom electrode 4 is formed at a predetermined position on a substrate 3 and an ultra-fine particle layer 1 having the same crystal structure and formed of the same main component as those of a piezoelectric layer 2 is formed on the bottom electrode 4. Here, the ultra-fine particle layer 1 contains PZT. The PZT type piezoelectric layer 2 is formed on the ultra-fine particle layer 1, and a top electrode 5 is formed on the piezoelectric layer 2. Incidentally, when the substrate 3 functions also as the bottom electrode 4, the ultra-fine particle layer 1 is directly disposed on the substrate 3 and the piezoelectric layer 2 is formed on the ultra-fine particle layer 1.

In comparison with the conventional piezoelectric device shown in FIGS. 14 and 15, no adhesive is used between the substrate and the piezoelectric layer but the ultra-fine particle layer having substantially the same main component as that of the piezoelectric body is interposed in this embodiment. Therefore, the possibility is low that the vibration of the piezoelectric body is impeded by the ultra-fine particle layer so interposed. Moreover, because the ultra-fine particle layer has the same main component and the same crystal structure as those of the piezoelectric body, it has high adhesion with the piezoelectric layer.

Figure 8A:
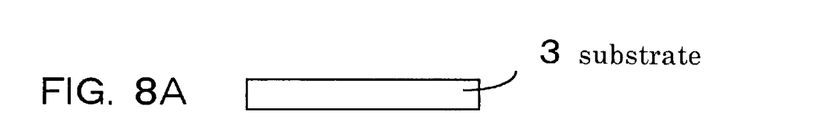
FIGS. 8A to 8E are a schematic view showing a production process according to Embodiment 1 of the present invention.
Figure 8B:
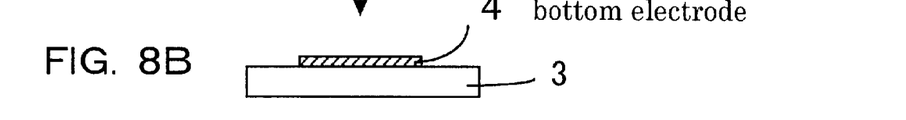
Figure 8C:
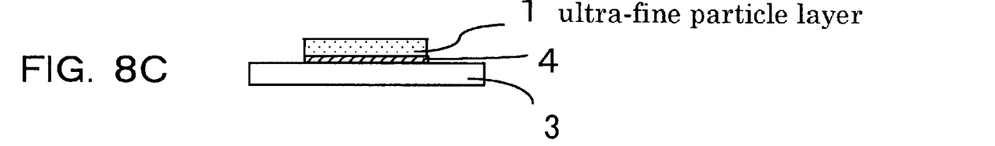
Figure 8D:
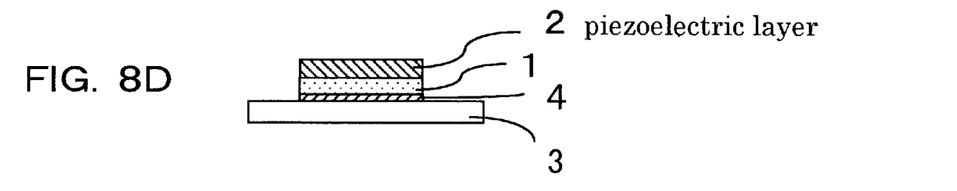
Figure 8E:
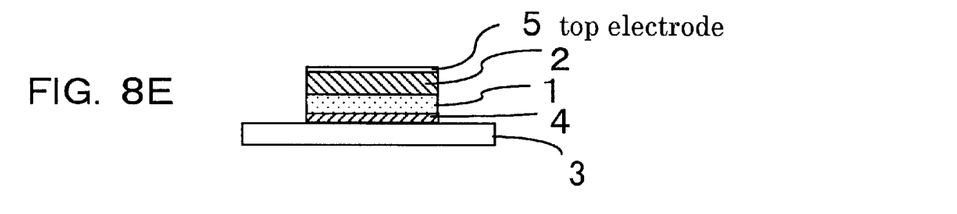
Figure 9:
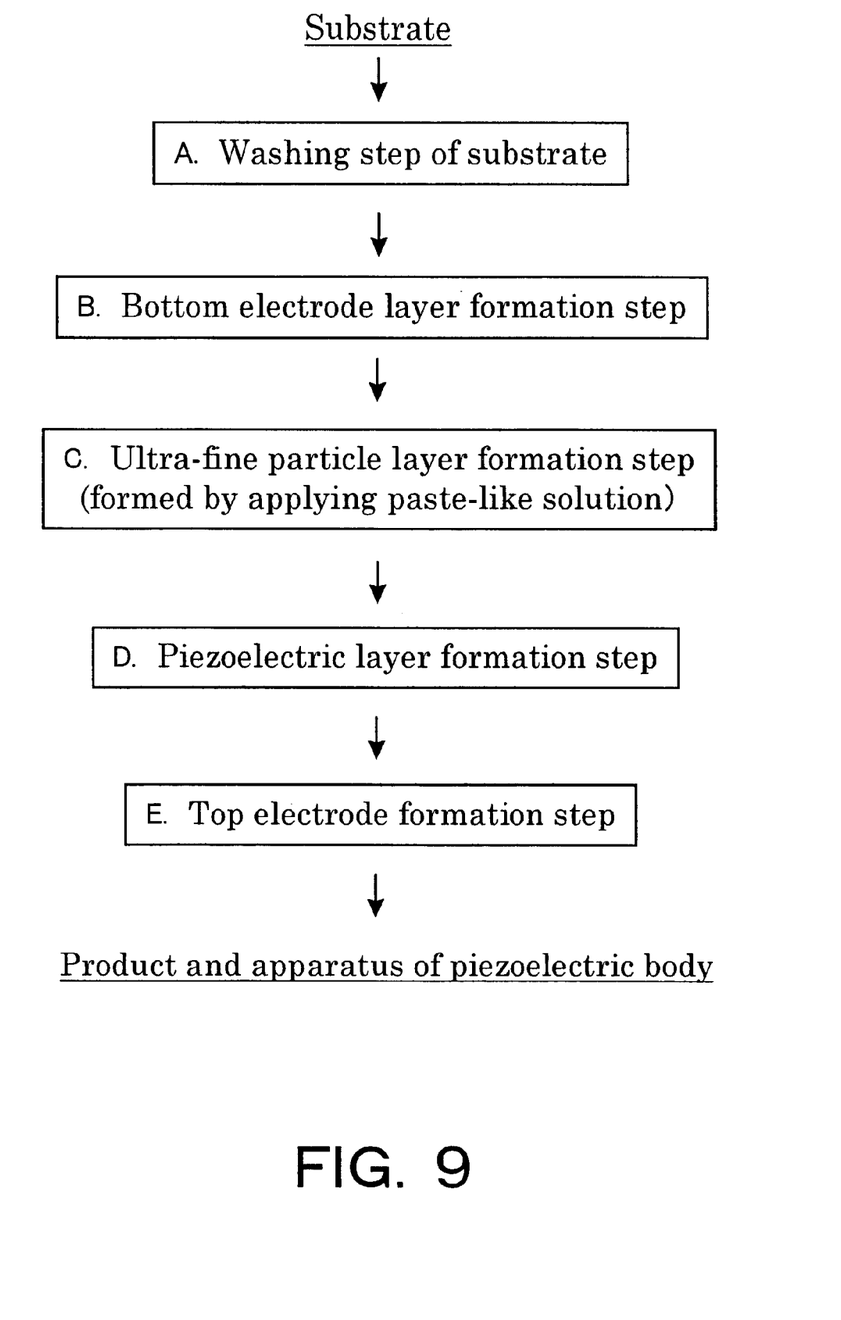
FIG. 9 is a flowchart showing the production process according to Embodiment 1 of the present invention.

A method of producing the piezoelectric device in Embodiment 1 according to the present invention will be explained with reference to FIGS. 8 and 9. FIGS. 8A to 8E show a schematic view of the production process of the piezoelectric device and FIG. 9 shows a flowchart of the production process.

First, the substrate is washed (step A). The bottom electrode 4 is then formed by vacuum deposition or sputtering on the surface of the substrate 3 (step B). More concretely, after a silicon wafer is washed, a thermal oxidation film having a thickness of about 1,000 angstroms is formed as a diffusion barrier layer for preventing the reaction between an intermediate layer Ti film and Si. Subsequently, a Ti film as an intermediate layer is sputtered to a thickness of about 500 angstroms as an adhesion improving layer with a Pt film. The Pt film serving as the bottom electrode 4 is sputtered to a thickness of about 1,000 to about 3,000 angstroms. This Ti film is sputtered with an argon flow rate of 11 sccm, RF power of 0.2 kW and a pressure of 4 mTorr. The Pt film is sputtered with an argon flow rate of 120 sccm, RF power of 2 kW and a pressure of 4 mTorr. Here, the reason why the bottom electrode is formed of Pt is because Pt does not undergo denaturation by a high temperature heat-treatment. The Pt film thus sputtered does not exhibit a remarkable orientation, but has relatively strong orientation of (111) plane, and is suitable for orientation of PZT from the lattice gap with Ti as the underlying layer.

Next, in the formation step of the ultra-fine particle layer (step C), a paste-like solution of ultra-fine particles having the same crystal structure and formed of the same main component as those of the piezoelectric layer is applied to the substrate 3. This embodiment uses the paste-like solution of the ultra-fine particles containing PZT.

The paste-like solution is prepared by adding about 1% of polyvinyl alcohol (hereinafter called "PVA"), as a formation adjuvant, to a starting powder material containing the same PZT having a particle size of not greater than 1 μm as that of the piezoelectric layer 2, kneading the mixture and defoaming the mixture. This paste-like solution is applied uniformly by printing or spin coating or dipping to the substrate 3, forming the ultra-fine particle layer 1. The viscosity of the paste-like solution can be regulated by adjusting the blending ratio of the formation adjuvant and the mode of kneading. Therefore, the thickness of the resulting ultra-fine particle layer can be adjusted to several microns to dozens of microns.

In the next step D, a sinter of the piezoelectric body having the same crystal structure and formed of the same main component as those of the ultra-fine particle layer 1, or its green sheet, is brought into pressure contact with the ultra-fine particle layer 1 and is integrally fired to form the piezoelectric layer 2. Here the paste-like solution containing PZT is first applied onto the substrate and then the sinter of the piezoelectric body containing PZT or its green sheet is brought into pressure contact. Pressurization is effected at 0.5 to 2 kgf, and the piezoelectric layer 2 is formed by conducting firing at 600 to 900° C. for 0.5 to 2 hours in the atmosphere of open air. The piezoelectric layer 2 has a thickness of about 80 μm in the resulting piezoelectric device inclusive of the ultra-fine particle layer 1.

When the crystal structure of the piezoelectric layer 2 inclusive of this ultra-fine particle layer 1 is examined by X-ray diffraction, a crystal peak of a perovskite type structure is detected. In this case, a sharper peak is observed in comparison with the X-ray diffraction peak when only the ultra-fine particle layer 1 is formed.

Finally, a gold electrode (top electrode 5) is formed by vacuum deposition on the surface of this piezoelectric layer 2 in a top electrode formation step (step E). When the properties of this electrode are measured, it exhibits excellent properties, i.e. a specific dielectric constant of 1,200 and a voltage strain constant of 140 pC/N.

Embodiment 2

Figure 2:
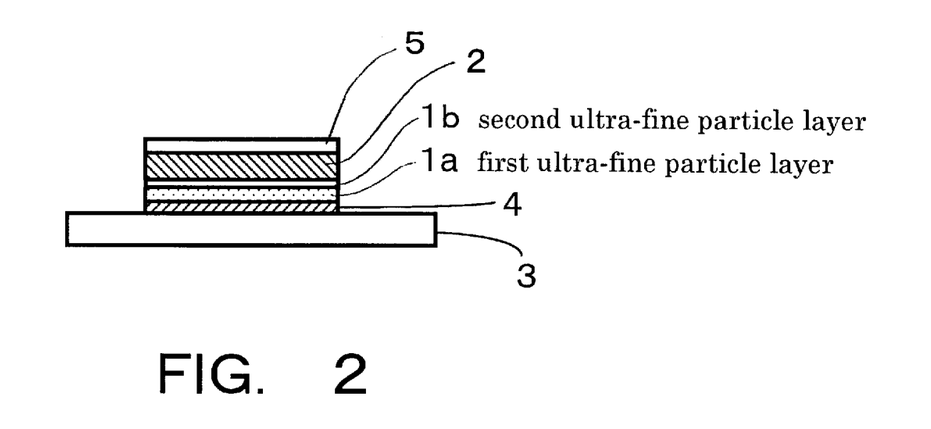
FIG. 2 is a schematic view showing a construction of a piezoelectric device according to Embodiment 2 vof the present invention.

Next, the piezoelectric device according to Embodiment 2 will be explained with reference to the drawings. FIG. 2 is a longitudinal sectional view showing schematically the construction of the piezoelectric device according to Embodiment 2. The bottom electrode 4 is formed at a predetermined position on the substrate 3. The first ultra-fine particle layer 1a is formed on the bottom electrode 4 by ejecting and depositing ultra-fine particles made of the same main component and having the same crystal structure as those of the piezoelectric layer on the substrate. A paste-like solution of the same ultra-fine particles is further applied, forming the second ultra-fine particle layer 1b. Here, both of the first and second ultra-fine particle layers 1a and 1b contain PZT. The PZT type piezoelectric layer 2 is formed on the second ultra-fine particle layer 1b, and the top electrode 5 is formed further on the piezoelectric layer 2. Incidentally, when the substrate 3 functions also as the bottom electrode 4, the first ultra-fine particle layer 1a is formed directly on the substrate 3 and the dielectric layer 2 is formed on the second ultra-fine particle layer 1b.

In comparison with the conventional piezoelectric device shown in FIG. 14, the piezoelectric device according to this embodiment does not use the adhesive between the substrate and the dielectric layer, but interposes the ultra-fine particle layers. Therefore, the piezoelectric device of this embodiment has the lower possibility that the vibration of the piezoelectric body is impeded in the ultra-fine particle layers so interposed. Moreover, because this embodiment utilizes energy of collision of the ultra-fine particle, it can directly form the piezoelectric layer 2 on the substrate at a lower temperature.

Figure 10:
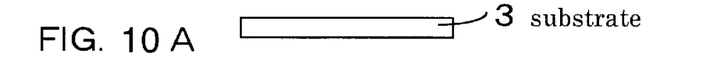
FIGS. 10A to 10F are,a schematic view showing a production process according to Embodiment 2 of the present invention.
Figure 11:
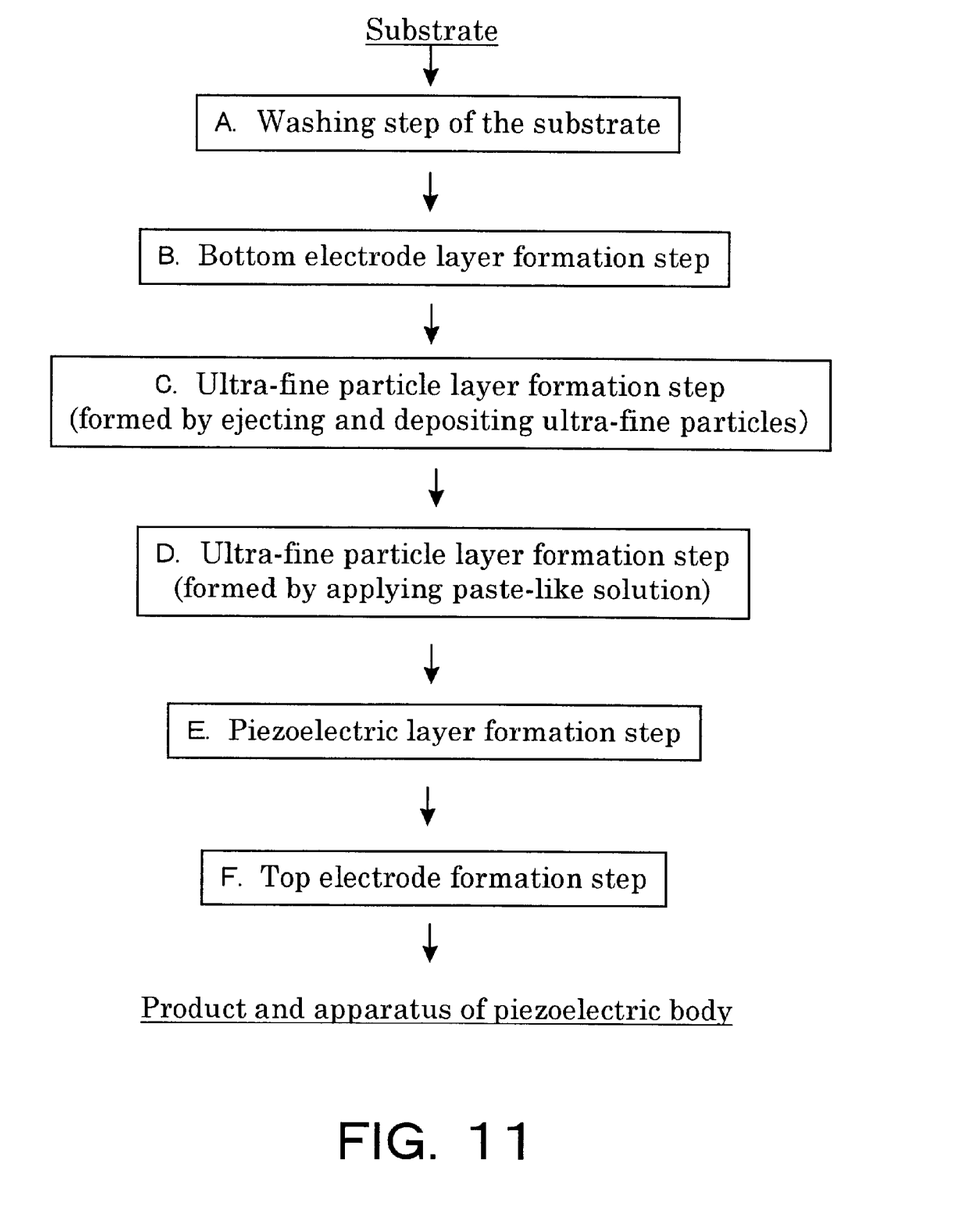
FIG. 11 is a flowchart showing the production process according to Embodiment 2 of the present invention.

The production method of the piezoelectric device in Embodiment 2 of the present invention will be explained with reference to FIGS. 10 and 11. FIGS. 10A to 10F show a schematic view of the production process of the piezoelectric device and FIG. 11 is a flowchart of the production process.

First, the substrate 3 is washed (step A). The bottom electrode 4 is then formed by vacuum deposition or sputtering on the surface of the substrate 3 so washed (step B). More concretely, a Ti film as an intermediate layer is sputtered to a thickness of about 500 angstroms on the substrate made of silicon, or the like, on which a thermal oxidation film having a thickness of about 1,000 angstroms is formed. A Pt film which is to serve as the bottom electrode 4 is then sputtered to about 1,000 to about 3,000 angstroms. Sputtering of the Ti film is conducted with an argon flow rate of 11 sccm, RF power of 0.2 kW and a pressure of 4 mTorr. Sputtering of the Pt film is conducted with an argon flow rate of 120 sccm, RF power of 2 kW and a pressure of 4 mTorr.

In the next step C, ultra-fine particles are ejected and deposited to form the first ultra-fine particle layer 1a as the first stage. In the next step D, a paste-like solution of the same ultra-fine particles is applied as the second stage, forming thereby the second ultra-fine particle layer 1b. Here, the same ultra-fine particles containing PZT as the piezoelectric layer are used. Here, the ultra-fine particle layer 1a and the ultra-fine particle layer 1b are distinguished processwise, but they exhibit the same characteristics in the construction of the vibration portion in the piezoelectric device according to the present invention. Therefore, they are regarded as the same layer as the ultra-fine particle layer.

In the step C, the ultra-fine particle layer 1a is formed by ejecting and depositing the ultra-fine particles 15 to the substrate 3. This ejection-deposition method is known in the art, and is described in, for example, Japanese Patent Laid-Open No. 188503/1992 and Gashu, "Gas Deposition of Ultra-Fine Particles" ("Vacuum", Vol. 35, No. 7, 1992, pp649–653). This method mixes ultra-fine particles having a particle size of not greater than 1 μm with an inert gas (nitrogen, helium, argon, hydrogen gas, etc), converts the particles to an aerosol, carries the aerosol by using the gas flow, and ejects and deposits them to the substrate.

The substrate 3 is first heated to about 130 to about 200° C., and the PZT-containing ultra-fine particles 15 are ejected and deposited at a high speed through an injection nozzle 14 to the upper surface of the substrate while being carried by the inert gas stream of $N_2$.

At this time, the moving speed of the stage holding the substrate 3 is varied between 1 to 125 μm/s so that the film thickness of the ultra-fine particle layer 1a can be adjusted. In Embodiment 2, a film thickness of about 10 μm is obtained by reciprocating five times the stage at a film formation rate of about 125 μm/s within the same area.

In the next step D, a paste-like solution of the same ultra-fine particles is applied to form the ultra-fine particle layer 1b.

The paste-like solution is prepared by adding about 1% of polyvinyl alcohol (hereinafter called "PVA") as a formation adjuvant to the starting powder material containing the same PZT as the piezoelectric layer 2 and consisting of particles having a particle size of not greater than 1 μm. This paste-like solution is uniformly applied to the substrate 3, on which the ultra-fine particle layer 1a is formed, by printing, spin-coating, dipping, or the like.

In the next step E, a sinter or green sheet of the dielectric body is brought into pressure contact with the substrate on which the ultra-fine particle layers 1a and 1b are formed, and is integrally fired, forming the piezoelectric layer 2. Here, after the ultra-fine particle layer 1b is formed, a sinter of the piezoelectric body containing the same PZT or its rapped green sheet, is brought into pressure contact. Pressurization is conducted at 0.5 to 2 kgs, and firing is conducted at 600 to 900° C. for 0.5 to 2 hours in the atmosphere of open air, giving the piezoelectric layer 2. In the resulting piezoelectric device, the thickness of the piezoelectric layer 2 inclusive of the ultra-fine particle layer 1 is about 80 μm.

When the crystal structure of the piezoelectric layer 2 inclusive of this ultra-fine particle layer 1 is examined by X-ray diffraction, a crystal peak of a perovskite type structure is detected. This peak is sharper than the X-ray diffraction peak when only the ultra-fine particle layer 1 is formed.

Finally, in the top electrode formation step (step F), the gold electrode (top electrode 5) is vacuum deposited to the surface of this piezoelectric layer 2. When the properties are measured, excellent properties such as a specific dielectric constant of 1,200 and a voltage strain constant of 150 pC/N can be obtained.

Embodiment 3

Next, the production method of Embodiment 3 will be explained with reference to the drawings. The construction of the piezoelectric device is the same as when the production method of Embodiment 1 is employed, as shown in FIG. 1. In other words, the bottom electrode 4 is formed at a predetermined position on the substrate 3. The ultra-fine particle layer 1 is formed on the top electrode by ejecting and depositing the ultra-fine particles having the same crystal structure and made of the same main component as those of the piezoelectric body. Here, the ultra-fine particle layer 1 is formed by using ultra-fine particles containing PZT. Furthermore, the ultra-fine particle layer 1 and the PZT type piezoelectric layer 2 are bonded using the hydrogen bonds. The top electrode 5 is formed on the upper surface of the piezoelectric layer 2. Incidentally, when the substrate 3 functions also as the bottom electrode 4, the ultra-fine particle layer 1 is disposed on the substrate 3 and the piezoelectric layer 2 is bonded to the ultra-fine particle layer 1.

In comparison with the conventional piezoelectric device shown in FIG. 14, the piezoelectric device of this embodiment does not use the adhesive between the substrate and the piezoelectric layer but interposes the ultra-fine particle layer having substantially the same component as that of the piezoelectric body. Therefore, the possibility is lower that the vibration of the piezoelectric body is impeded in the ultra-fine particle layer so interposed. Moreover, since this embodiment utilizes collision energy of the ultra-fine particles, it can directly form the piezoelectric layer on the substrate at a lower temperature than in the prior art. Since the ultra-fine particle layer and the piezoelectric body are bonded by utilizing the hydrogen bonds, the thickness of the bonding layer is as thin as a few angstroms in comparison with the conventional adhesive layer.

Figure 12A:
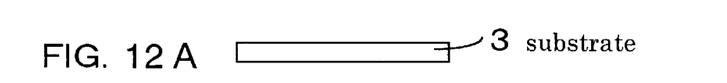
FIGS. 12A to 12F are a schematic view showing a production process according to Embodiment 3 of the present invention.
Figure 12B:
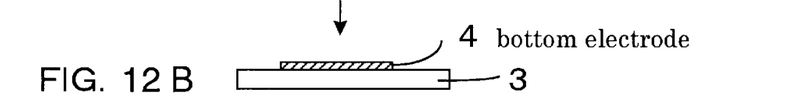
Figure 12C:
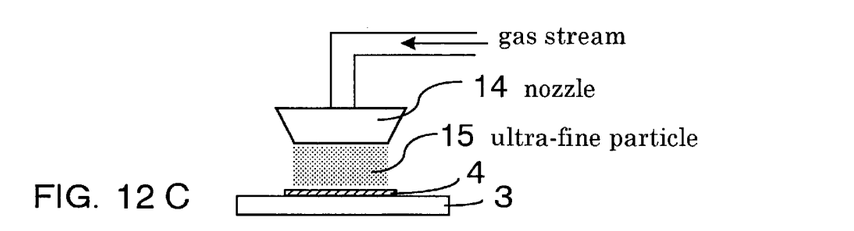
Figure 12D:
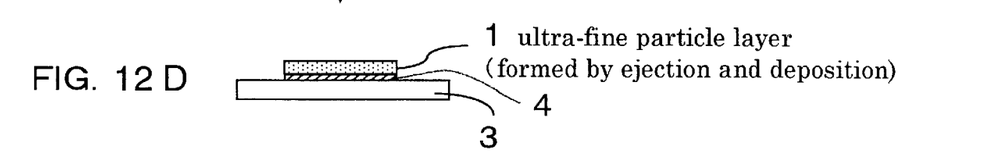
Figure 12E:
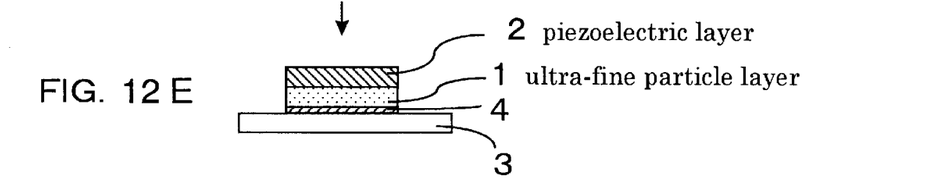
Figure 12F:
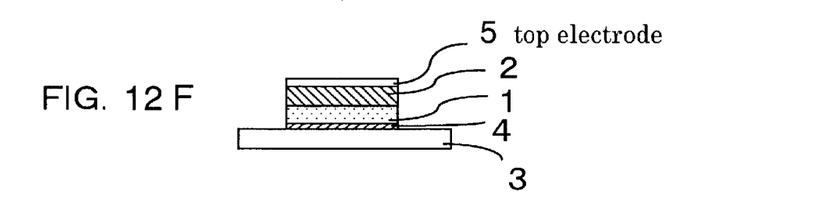
Figure 13:
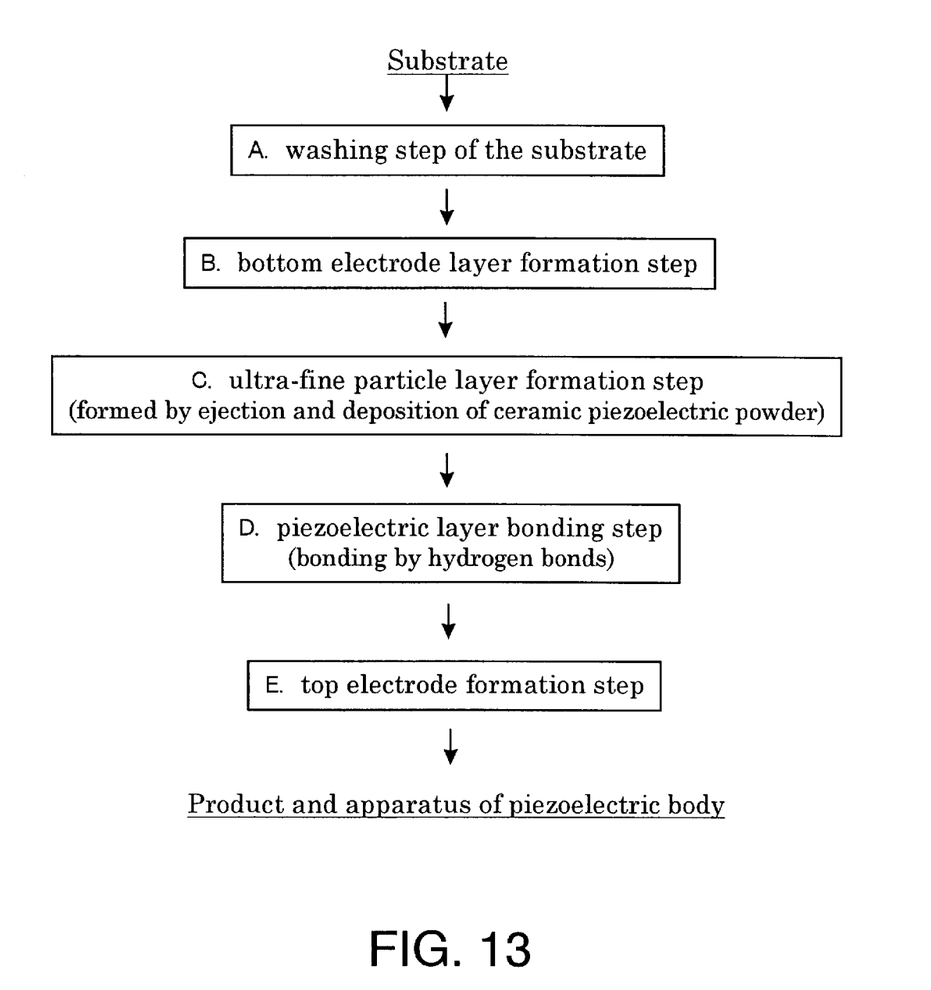
FIG. 13 is a flowchart showing the production process according to Embodiment 3 of the present invention.

A production method of a piezoelectric device according to Embodiment 3 will be explained in detail with reference to FIGS. 12 and 13. FIGS. 12A to 12F show a schematic view of the production process of the piezoelectric device and FIG. 13 is a flowchart of the production process.

First, the top electrode 4 is formed (step B) by vacuum deposition or sputtering on the surface of the substrate 3 which is washed by the substrate washing step (step A). More concretely, a Ti film serving as an intermediate layer is sputtered to about 500 angstroms on the substrate on which a thermal oxidation film having a thickness of about 1,000 angstroms is formed. Next, a Pt film serving as the bottom electrode 4 is sputtered to a thickness of about 1,000 to about 3,000 angstroms. Sputtering of the Ti film is conducted with an argon flow rate of 11 sccm, RF power of 0.2 kw and a pressure of 4 mTorrs. Sputtering of the Pt film is conducted with an argon flow rate of 120 sccm, RF power of 2 kW and a pressure of 4 mTorrs.

In the next formation step of the ultra-fine particle layer (step C), the ultra-fine particles 15 are ejected and deposited onto the substrate 3. Here, the ultra-fine particles containing the same PZT as the piezoelectric layer is used. This method is a film formation method which mixes ultra-fine particles having a particle size of not greater than 1 μm with an inert gas (nitrogen, helium, argon, hydrogen gas, etc) to form an aerosol, carries the aerosol by the flow of the gas, and ejects and deposits the ultra-fine particles to the substrate.

First, the substrate 3 is heated to about 130 to about 200° C., and the ultra-fine particles 15 containing PZT are carried by the inert gas flow of $N_2$ and are ejected and deposited onto the upper surface of the substrate 3 through an injection nozzle 14.

At this time, the moving speed of the stage holding the substrate 3 is changed between 1 to 125 μm so that the film thickness of the ultra-fine particle layer 1 can be adjusted. In Embodiment 1, the stage is allowed to reciprocate five times at a film formation rate of about 125 μm/s, and a film thickness of about 10 μm is obtained.

The next step D is the step for bonding the ultra-fine particle layer 1 and the piezoelectric layer 2 using the hydrogen bonds.

Here, a sinter of the PZT type piezoelectric body is used for the piezoelectric layer 2. This piezoelectric layer 2 is polished using alumina having a grain size of 0.05 μm to a mean surface coarseness (Ra) of about 40 nm. Surface polishing is similarly conducted for the ultra-fine particle layer 1, too, and Ra of about 20 to 40 nm is obtained. Adsorption of the hydroxyl group is caused by a dry process. First, a steam is introduced to $4\times10^{-2}$ Pa and is ionized inside an ion source by electron collision. Ion irradiation is then conducted to the surfaces of the ultra-fine particle layer 1 and the piezoelectric body 2 under the condition of an ion acceleration voltage of 300 V and an ion current density of 200 μA/cm². The ion irradiation time is determined by measuring the hydrogen amount existing on the surface of the sample (here, the ultra-fine particle layer 1 and the piezoelectric layer 2). After the hydroxyl groups are adsorbed to each surface, the members are brought into pressure contact in open air for bonding. Pressurization is conducted at 30 MPa at 400° C. and 150 MPa at 250° C. When a rapped green sheet is used for the piezoelectric layer 2 in place of the sinter, firing is conducted at 600 to 900° C. for 30 minutes to 2 hours in open atmosphere after pressurization to form the piezoelectric layer 2. The bonding strength is evaluated by the tensile test. In the piezoelectric device so produced, the thickness of the piezoelectric layer 2 inclusive of the ultra-fine particle layer 1 is about 80 μm.

Finally, a gold electrode (top electrode 5) is formed by vacuum deposition on the surface of the piezoelectric layer 2 by the top electrode formation step (step E). When the properties are measured, excellent properties such as a specific dielectric constant of 1,200 and a voltage strain constant of 150 pC/N can be obtained.

Next, the construction and characteristics of the ultrasonic motor using the piezoelectric device produced by the. production method of Embodiments 1 to 3 for the vibration portion will be explained.

Figure 17:
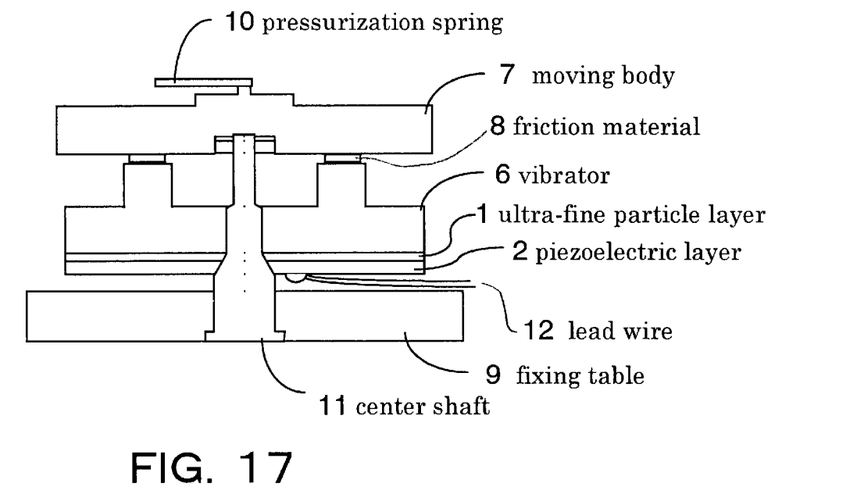
FIG. 17 is a longitudinal sectional view of a ultrasonic motor using the piezoelectric device according to the present invention.
Figure 18:
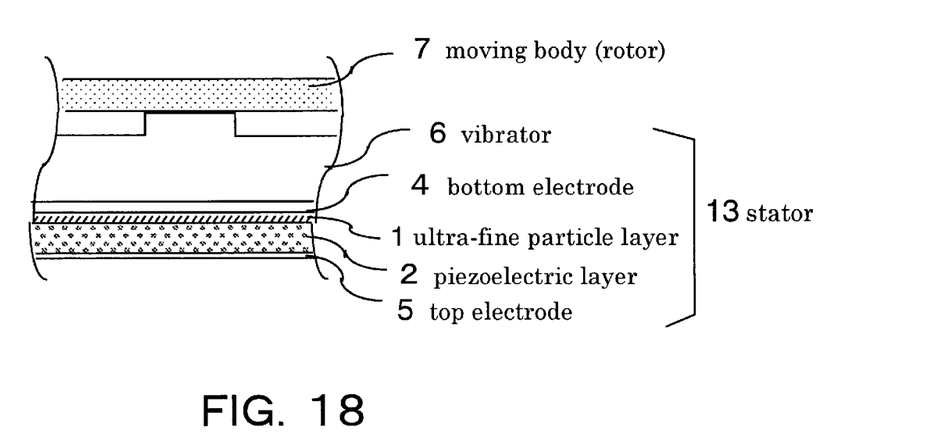
FIG. 18 is a schematic view showing the structure of the vibration portion of the ultrasonic motor using the piezoelectric device according to the present invention.

FIG. 17 shows the basic construction of the ultrasonic motor using the piezoelectric device of this invention for the vibration portion, and FIG. 18 shows the construction of the vibration portion. The vibration body 6 to which the piezoelectric layer 2 is provided through the ultra-fine particle layer 1 is made of a flexible member of a metal, and is supported by a center shaft 11 by punching or like means. The center shaft 11 functions as a guide for assembly and the piezoelectric device is brought into pressure contact with the vibration body 6 by a pressurization spring 10 disposed above them. Here, signals having phases that are time-wise different by about 90° degrees are applied to two lead wires 12, so that mechanical progressive waves due to bending occur in the piezoelectric layer 2 and the vibration body 6 and the moving body 7 brought into pressure contact with the vibration body 6 is rotated. A ultrasonic motor having the construction of the piezoelectric device of the present invention is produced. A motor diameter is 4 mmφ, and aluminum or SUS304 steel is used for the vibration body 6. The vibration body 6 is shaped by machining a round bar of the raw material by an NC lathe, and a vermicular motion surface, too, is finished by cutting. A composite plastic containing a carbon fiber is used for a friction material 8.

Figure 3:
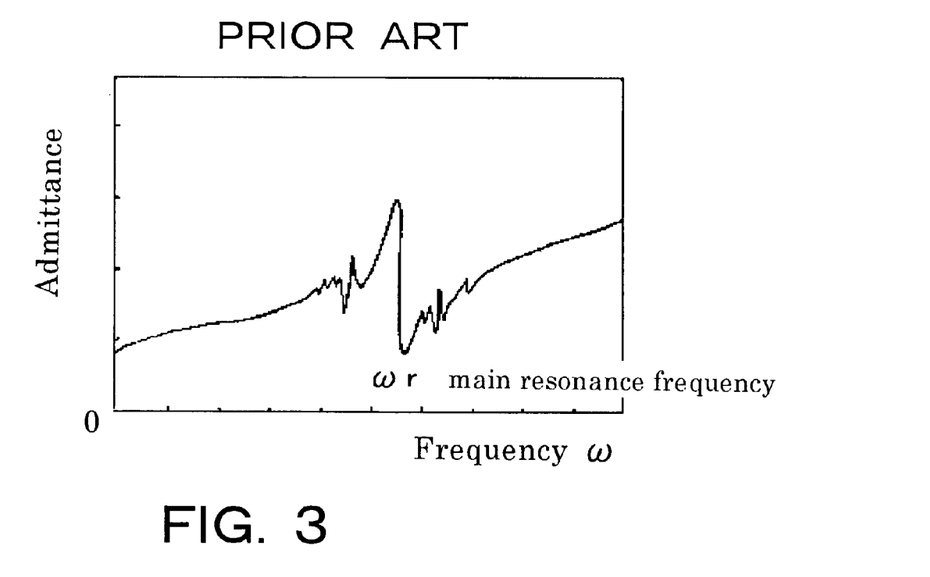
FIG. 3 is a graph showing characteristics of a ultrasonic motor according to the prior art.
Figure 4:
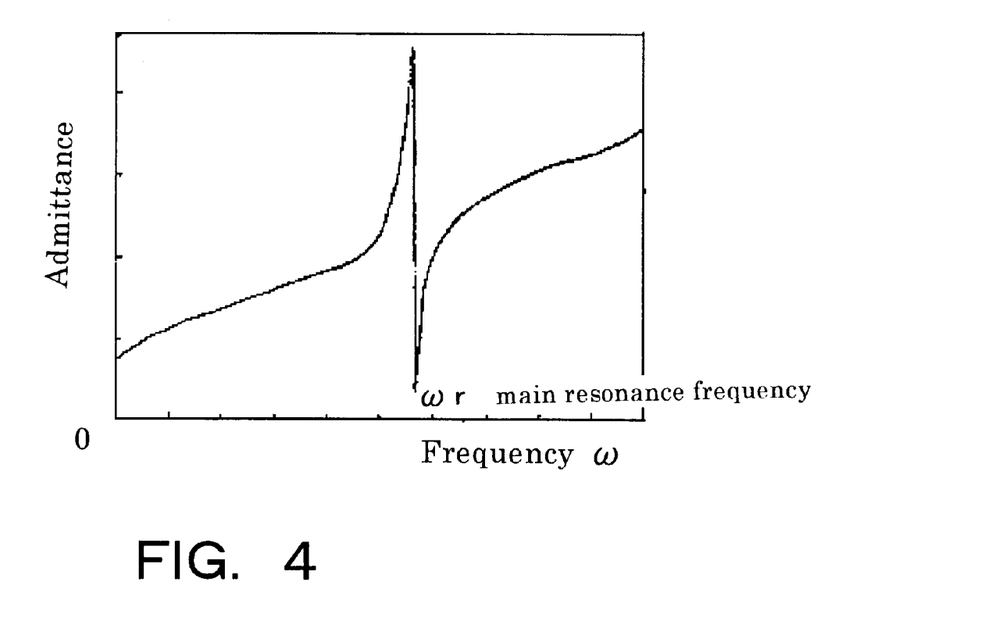
FIG. 4 is a graph showing characteristics of a ultrasonic motor according to the present invention.

The characteristics of the ultrasonic motors produced by the production methods of Embodiments 1 to 3 are tabulated below. FIG. 3 shows the admittance characteristics of the ultrasonic motor that is equipped with the ultra-fine particle layer 1 produced by the conventional bonding method using the adhesive 16, and FIG. 4 shows the admittance characteristics of the ultrasonic motor of the present invention including the vibration body equipped with the ultra-fine particle layer 1 formed by the production method of this embodiment. However, these admittance characteristics are measured under the state where the moving body is removed, that is, where the vibration body is free in the vertical direction. Table 1 shows the outline of the motor specification.

TABLE 1

| vibration mode | diametric direction | primary |
|---|---|---|
| | circumferential direction | secondary |
| vibration body | material | aluminum SUS304 |
| | outer diameter | 4 mm |
| | thickness | 1 mm |
| piezo-electric vibrator | outer diameter | 4 mm |
| | thickness of piezo-electric layer | 0.08 mm |
| | thickness of ultra-fine particle layer | 0.001 to 0.01 mm |
| | piezoelectric constant | approx. $140 \times 10^{-12}$ C/N |
| | mechanical Q value | approx. 1,500 |

Whereas spurious vibration can be observed at points other than the main resonant point in FIG. 3, the mechanical Q value is high and spurious vibration at portions other than the main resonance point cannot be observed in FIG. 4.

In these admittance characteristics, the spurious vibration is the phenomenon that results from irregular reflection of force on the boundary surface and represents the degree of damping during the propagation of the force. Therefore, it can be appreciated that performance of the actuator according to the present invention is drastically improved in comparison with that of the conventional actuator.

Figure 5:
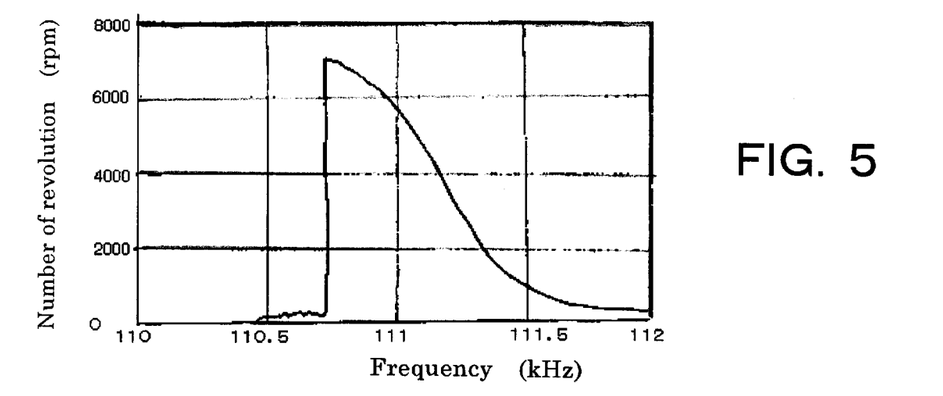
FIG. 5 is a graph showing frequency-v-rotation characteristics of the ultrasonic motor according to the present invention.

FIG. 5 is a graph showing frequency-v-number of revolution characteristics of the progressive ultrasonic motor equipped with the ultra-fine particle layer according to the present invention. The driving voltage is approximately 6 V p-p in terms of a sine wave and the pressurization force of the moving body 7 to the vibration body 6 represents the characteristics at approximately 10 gf.

According to the construction of the present invention, the range of the rotating frequency is relatively broad and the maximum number of revolution is as high as at least 6,000 rpm. Therefore, the ultrasonic motor can be applied to the medium to high speed ranges, too, and this represents utility of the present invention.

Figure 6:
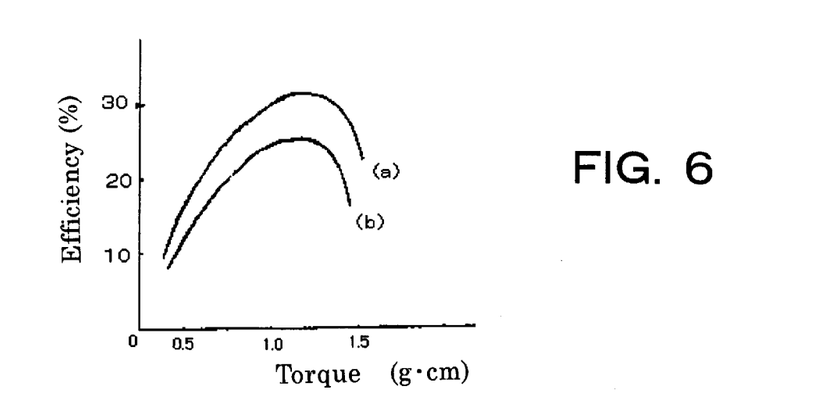
FIG. 6 is a graph showing efficiency of the ultrasonic motor according to the present invention.
Figure 7:
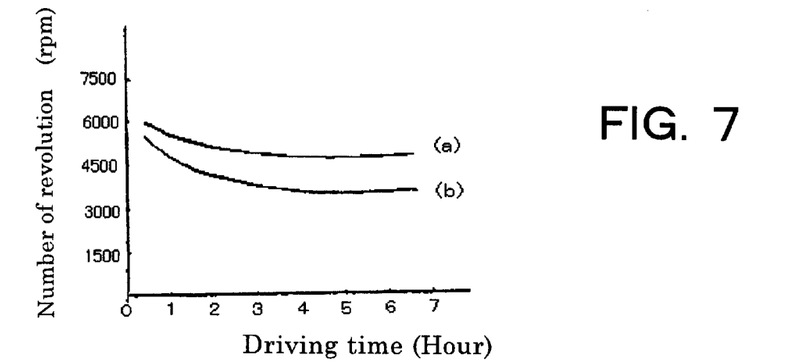
FIG. 7 is a graph showing durability of the ultrasonic motor according to the present invention.

Next, FIG. 6 shows the measurement result of efficiency that represents torque performance of the ultrasonic motor, and FIG. 7 shows the measurement result of durability. Symbol (a) in these graphs represents the measurement result of the ultrasonic motor having the vibration portion equipped with the ultra-fine particle layer according to the present invention, and symbol (b) represents the measurement result of the ultrasonic motor having the vibration portion according to the prior art example. As can be appreciated from these measurement results, the ultrasonic motor having the construction of the vibration portion according to the present invention is obviously superior to the prior art example in both efficiency and durability. It can be thus said that the ultrasonic motor having the vibration portion formed by bonding the vibration body and the piezoelectric body through the ultra-fine particle layer can improve both performance and durability.

In other words, it can be said that the construction of the vibration portion equipped with the ultra-fine particle layer according to the present invention can accomplish high efficiency even in a ultrasonic motor having a small diameter and a small thickness.

In the embodiments of the present invention described above, the composition of the PZT type piezoelectric body comprises a pure two-component system. However, a three-component system such as magnesium lead niobate—lead zirconate—lead titanate may be used in order to improve the piezoelectric characteristics, or additives maybe added such as iron for improving the withstand voltage, chromium for reducing the change with time or antimony for improving the strength. In this case, the composition of the starting ultra-fine particle powder material may be prepared in such a manner as to correspond to the desired composition.

In the embodiments described above, the inert gas for forming the ultra-fine particles of the ceramic piezoelectric body may be $N_2$, He and Ar.

Incidentally, the ultrasonic motors utilizing the piezoelectric vibrator include a steady wave type and a progressive wave type, and the construction of the vibration portion according to the present invention can be applied to both of these types.

EFFECT OF THE INVENTION

According to the present invention, the ultra-fine particle layer having the same crystal structure and consisting of the same main component as those of the piezoelectric body can be formed directly on the substrate. Therefore, the piezoelectric body and the substrate as a bulk can be bonded through the ultra-fine particle layer without using the conventional adhesive.

According to the present invention, further, the ultra-fine particle layer is formed on the substrate having the bottom electrode formed thereon, or on the substrate functioning as the bottom electrode. Therefore, the adhesive layer that will otherwise lower the piezoelectric characteristics between the piezoelectric layer and the substrate can be eliminated. In consequence, the force generated from the piezoelectric layer propagates as such without being reflected irregularly or absorbed by the adhesive layer. Furthermore, the unnecessary spurious vibration does not occur and excellent admittance characteristics can be obtained. Moreover, efficiency and durability of the motor can be improved. The ultrasonic motor can improve electrical and mechanical performance and reliability as a driving source having a miniature construction such as a micro-machine. Because the ultra-fine particles not greater than 1 μm are used, a compact film can be formed, adhesion with the substrate can be improved and eventually, adhesion with the piezoelectric layer can be improved.

What is claimed is:

1. A piezoelectric device comprising: a substrate; a piezoelectric layer formed on the substrate; and a particle layer comprising a paste-like solution containing granulate particles and a binding agent formed between the substrate and the piezoelectric layer, the granulate particles being formed of substantially the same main component as that of the piezoelectric layer.

2. A piezoelectric device having a piezoelectric layer formed on a substrate, the piezoelectric device comprising: a particle layer comprising a discontinuous layer consisting essentially of granulate particles formed between the substrate and the piezoelectric layer, the granulate particles having substantially the same crystal structure as that of the piezoelectric layer.

3. A piezoelectric device according to claim 1; wherein the crystal structure of the granulate particles is substantially the same as that of the piezoelectric layer.

4. A piezoelectric device according to claim 1; wherein the granulate particles and the piezoelectric layer contain titanium, zirconium and lead.

5. A piezoelectric device according to claim 1; wherein the particle diameter of the granulate particles is not greater than 1 μm.

6. A piezoelectric device according to claim 2; wherein the granulate particles and the piezoelectric layer contain titanium, zirconium and lead.

7. A piezoelectric device according to claim 2; wherein the particle diameter of the granulate particles is not greater than 1 μm.

8. A piezoelectric device according to claim 1; further comprising another particle layer formed by ejecting and depositing the granulate particles onto the substrate between the particle layer and the piezoelectric layer.

9. A piezoelectric device according to claim 1; wherein the particle layer is bonded to the piezoelectric layer.

10. A piezoelectric device according to claim 9; wherein the particle layer and the piezoelectric layer are bonded by hydrogen bonds.

11. A piezoelectric device according to claim 1; wherein the granulate particles are formed of a piezoelectric material.

12. A piezoelectric device according to claim 1; wherein the granulate particles have substantially the same crystal structure as that of the piezoelectric layer.

13. A piezoelectric device according to claim 1; wherein the particle layer comprises a paste of the granulate particles and a formation adjuvant.

14. A piezoelectric device according to claim 13; wherein the formation adjuvant comprises one of polyvinyl alcohol and glycerin.

15. A piezoelectric device according to claim 1; wherein the piezoelectric layer is formed using a piezoelectric green sheet.

16. A piezoelectric device according to claim 1; wherein the piezoelectric layer is formed of PZT piezoelectric material.

17. A piezoelectric device according to claim 16; wherein the granulate particles are formed of PZT piezoelectric material.

18. A piezoelectric device comprising: a substrate; a piezoelectric layer formed on the substrate; and a particle layer comprised of particles and being disposed between the substrate and the piezoelectric layer, the particles having a different main component from that of the piezoelectric layer and having substantially the same crystal structure as that of the piezoelectric layer.

19. A piezoelectric device according to claim 18; wherein at least one of the particles and the piezoelectric layer contains titanium, zirconium and lead.

20. A piezoelectric device according to claim 18; wherein the particle diameter of the particles is not greater than 1 μm.

21. A piezoelectric device according to claim 18; wherein the particle layer comprises a paste-like solution containing the particles and a binding agent.

22. A piezoelectric device according to claim 18; wherein the particle layer is formed by ejecting and depositing the particles onto the substrate.

23. A piezoelectric device according to claim 18; wherein the particle layer is formed by ejecting and depositing the particles onto the substrate to form a first particle layer, and applying a paste-like solution containing the particles to the first particle layer to form a second particle layer.

24. A piezoelectric device according to claim 18; wherein the particle layer is bonded to the piezoelectric body.

25. A piezoelectric device according to claim 24; wherein the particle layer and the piezoelectric layer are bonded by hydrogen bonds.

26. A piezoelectric device according to claim 18; wherein the particles are formed of a piezoelectric material.

27. A piezoelectric device according to claim 18; wherein the particle layer comprises a paste of the particles and a formation adjuvant.

28. A piezoelectric device according to claim 27; wherein the formation adjuvant comprises one of polyvinyl alcohol and glycerin.

29. A piezoelectric device according to claim 18; wherein the piezoelectric layer is formed using a piezoelectric green sheet.

30. A piezoelectric device according to claim 18; wherein the piezoelectric layer is formed of PZT piezoelectric material.

31. A piezoelectric device according to claim 2; wherein the particle layer is formed by ejecting and depositing the granulate particles onto the substrate.

32. A piezoelectric device according to claim 2; wherein the particle layer is formed by directing an aerosol containing the granulate particles and a gas onto the substrate.

* * * * *